US012739946B2

(12) United States Patent
Beska et al.

(10) Patent No.: US 12,739,946 B2
(45) Date of Patent: Sep. 15, 2026

(54) HEATING SYSTEM INCLUDING CONDUCTIVE THREADS ACTING AS CAPACITIVE-BASED PROXIMITY SENSOR AND ATTACHING HEATING WIRE TO SUBSTRATE

(71) Applicant: GENTHERM GMBH, Odelzhausen (DE)

(72) Inventors: Jan Beska, Belle River (CA); Zoran Panic, Windsor (CA)

(73) Assignee: Gentherm GmbH, Odelzhausen (DE)

( * ) Notice: Subject to any disclaimer, the term of this patent is extended or adjusted under 35 U.S.C. 154(b) by 560 days.

(21) Appl. No.: 18/278,052

(22) PCT Filed: Feb. 25, 2022

(86) PCT No.: PCT/US2022/017841
§ 371 (c)(1),
(2) Date: Aug. 21, 2023

(87) PCT Pub. No.: WO2022/187083
PCT Pub. Date: Sep. 9, 2022

(65) Prior Publication Data

US 2024/0138027 A1 Apr. 25, 2024
US 2024/0237150 A9 Jul. 11, 2024

Related U.S. Application Data

(60) Provisional application No. 63/156,048, filed on Mar. 3, 2021.

(51) Int. Cl.
*H05B 3/00* (2006.01)
*B60N 2/00* (2006.01)
(Continued)

(52) U.S. Cl.
CPC ......... *H05B 3/0019* (2013.01); *B60N 2/0021* (2023.08); *B60N 2/5685* (2013.01);
(Continued)

(58) Field of Classification Search
CPC .... B60N 2/002; B60N 2/0027; B60N 2/0028; B60N 2/0033; B60N 2/0034;
(Continued)

(56) References Cited

U.S. PATENT DOCUMENTS

2014/0253151 A1* 9/2014 Kandler ............... B60N 2/0035 324/686
2015/0257205 A1* 9/2015 Hase ........................ H05B 3/16 219/539
(Continued)

FOREIGN PATENT DOCUMENTS

EP 2941089 A1 11/2015
WO WO-2019147800 A2 8/2019

OTHER PUBLICATIONS

International Search Report and Written Opinion of the ISA issued in PCT/US2022/017841, mailed Jun. 15, 2022; ISA/EP.

*Primary Examiner* — Scott J Walthour

(57) ABSTRACT

A heater/sensor assembly is configured to perform heating and proximity sensing and includes a heater carrier substrate including first and second surfaces. A heater wire is arranged in a predetermined pattern adjacent to and in contact with the first surface of the heater carrier substrate, wherein the heater wire is insulated. A proximity sensor includes a conductive thread attaching the heater wire to the first surface of the heater carrier substrate.

15 Claims, 8 Drawing Sheets

(51) Int. Cl.
*B60N 2/56* (2006.01)
*B62D 1/06* (2006.01)
*G01R 27/26* (2006.01)
*H05B 1/02* (2006.01)
*H05B 3/34* (2006.01)
*H05B 3/36* (2006.01)

(52) U.S. Cl.
CPC ........... *B62D 1/06* (2013.01); *G01R 27/2605* (2013.01); *H05B 1/0238* (2013.01); *H05B 3/342* (2013.01); *H05B 3/36* (2013.01); *B60N 2210/12* (2023.08); *H05B 2203/004* (2013.01); *H05B 2203/029* (2013.01)

(58) Field of Classification Search
CPC .... B60N 2210/12; B62D 1/06; H05B 1/0238; H05B 3/36
See application file for complete search history.

(56) References Cited

U.S. PATENT DOCUMENTS

| | | | | |
|---|---|---|---|---|
| 2018/0118247 | A1* | 5/2018 | Odate | B60R 1/04 |
| 2019/0226879 | A1* | 7/2019 | Lakatos | B62D 1/065 |

* cited by examiner

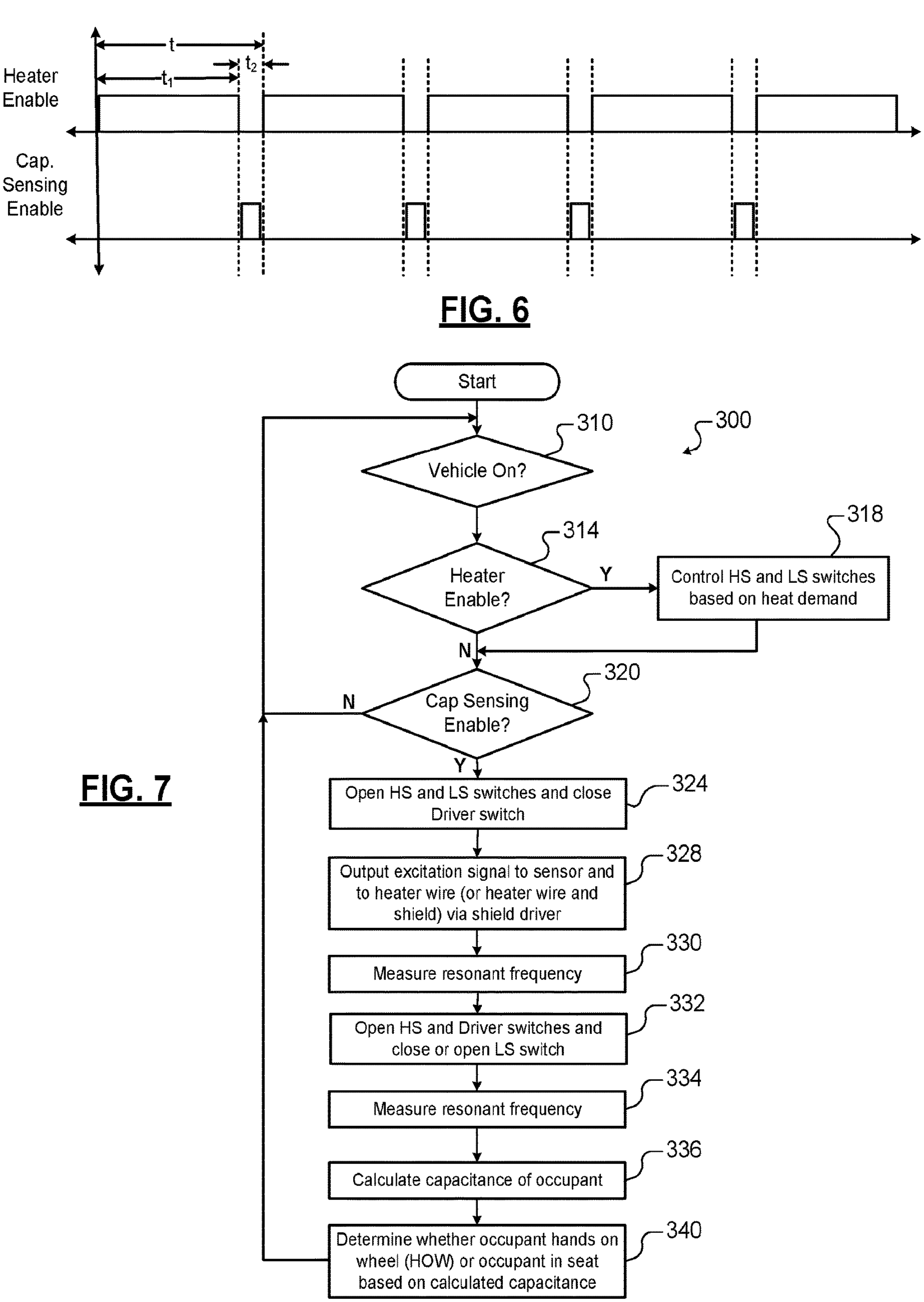
t
t2
t1
Heater
Enable
Cap.
Sensing
Enable
FIG. 6
Start
310
300
Vehicle On?
314
318
Heater
Enable?
Y
Control HS and LS switches
based on heat demand
N
320
N
Cap Sensing
Enable?
Y
FIG. 7
Open HS and LS switches and close
Driver switch
324
Output excitation signal to sensor and
to heater wire (or heater wire and
shield) via shield driver
328
Measure resonant frequency
330
Open HS and Driver switches and
close or open LS switch
332
Measure resonant frequency
334
Calculate capacitance of occupant
336
Determine whether occupant hands on
wheel (HOW) or occupant in seat
based on calculated capacitance
340

HEATING SYSTEM INCLUDING CONDUCTIVE THREADS ACTING AS CAPACITIVE-BASED PROXIMITY SENSOR AND ATTACHING HEATING WIRE TO SUBSTRATE

CROSS-REFERENCE TO RELATED APPLICATIONS

This application is a U.S. National Phase Application under 35 U.S.C. 371 of International Application No. PCT/US2022/017841, filed on Feb. 25, 2022, which claims the benefit of U.S. Provisional Application No. 63/156,048, filed on Mar. 3, 2021. The entire disclosures of the applications referenced above is are incorporated herein by reference.

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

Vehicles such as partially or fully autonomous vehicles may include an autonomous vehicle control system that automatically controls driving of the vehicle under certain conditions. The autonomous vehicle control systems typically include a navigation system, an array of external sensors such as radar or lidar sensors and actuators that control steering, braking and acceleration of the vehicle.

For partially autonomous vehicles, certain driving situations may require a driver to intervene and/or take over driving of the vehicle. For example, driving on a highway may be handled by the autonomous vehicle control system. Driver intervention may be requested in the event of an accident or construction on the roadway or when the vehicle starts exiting the highway. As a result, the vehicles will likely need to sense whether or not the occupant's hand or hands are on a steering wheel of the vehicle prior to disengagement of the vehicle control system.

Sensors located in seats of the vehicle may also be used to detect the presence or absence of an occupant of the vehicle. If an occupant is detected, safety restraints such as air bags and seat belt pretensioners may be selectively enabled or disabled.

SUMMARY

A heater/sensor assembly performing heating and proximity sensing includes a heater carrier substrate including first and second surfaces. A heater wire is arranged in a predetermined pattern adjacent to and in contact with the first surface of the heater carrier substrate, wherein the heater wire is insulated. A proximity sensor includes a conductive thread attaching the heater wire to the first surface of the heater carrier substrate.

In other features, a non-conductive thread is arranged adjacent to and in contact with the second surface of the heater carrier substrate. The conductive thread and the non-conductive thread attach the heater wire to the first surface of the heater carrier substrate. The conductive thread and the non-conductive thread loop around each other at stitch locations passing through the heater carrier substrate. The heater carrier substrate comprises a material selected from a group consisting of foam, felt, woven fabric and knitted fabric. The heater wire comprises a single insulated wire. The heater wire comprises a multi-strand insulated wire. The heater wire comprises a two or more insulated wires that are wound around each other.

In other features, the heater/sensor assembly is arranged around a steering wheel. The heater/sensor assembly is arranged in a vehicle seat assembly.

A capacitance measuring system for detecting an occupant of a vehicle includes the heater/sensor assembly. A measurement circuit is configured to output an excitation signal to the measurement circuit and the heater/sensor assembly; measure a resonant frequency of the measurement circuit and the heater/sensor assembly in response to the excitation signal; determine at least one capacitance value based on the resonant frequency; and determine whether a body part is in proximity to the proximity sensor based on the at least one capacitance value.

In other features, the measurement circuit includes an LC tank circuit. An excitation circuit is in communication with the LC tank circuit and is configured to generate the excitation signal that is output to the LC tank circuit. A frequency measurement circuit is in communication with the LC tank circuit and is configured to measure the resonant frequency in response to the excitation signal. A controller configured to trigger the excitation signal; receive the resonant frequency; determine the capacitance value based on the resonant frequency; and determine whether the body part is in proximity to the proximity sensor based on the capacitance value.

In other features, a driver circuit is arranged between the LC tank circuit and the heater wire and configured to drive the heater wire in response to the excitation signal. A shield layer is arranged on the second surface of the heater carrier substrate adjacent to the heater wire. The shield layer comprises a conductive layer attached to the second surface of the heater carrier substrate. The shield layer comprises a predetermined pattern of conductive thread attached to the second surface of the heater carrier substrate. The shield layer is connected by a capacitor to the heater wire and the driver circuit.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 6 is a timing diagram illustrating an example of time multiplexing of heating and capacitive sensing; and FIG. 7 is a flowchart illustrating an example of a method for operating a capacitive sensing and heating system according to the present disclosure.

In the drawings, reference numbers may be reused to identify similar and/or identical elements.

DETAILED DESCRIPTION

Figures 1A, 1B:
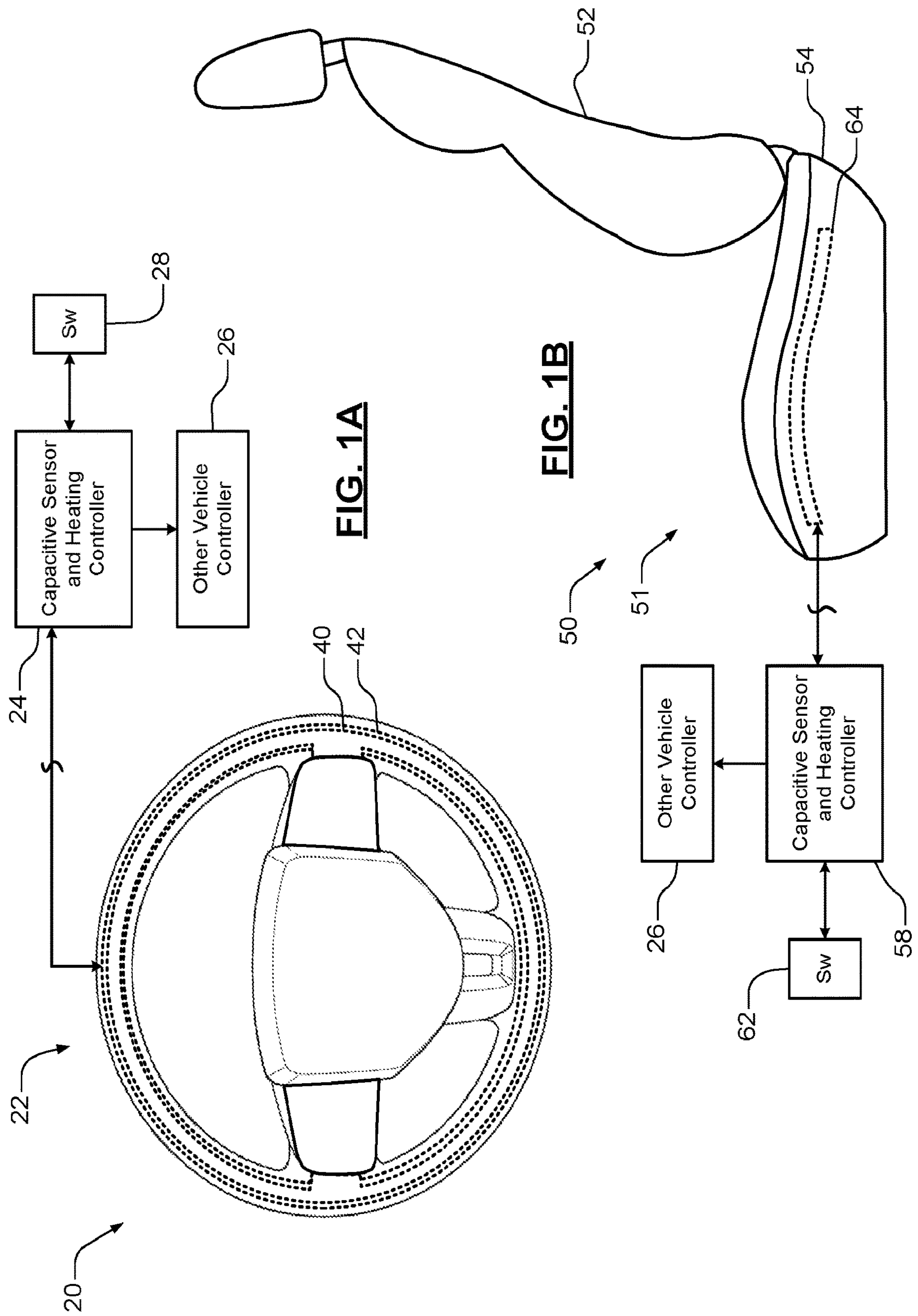
FIG. 1A is a plan view of an example of a steering wheel including a capacitive sensing and heating system with a heater/sensor assembly according to the present disclosure.
FIG. 1B is a side view of an example of a seat including a capacitive sensing and heating system with a heater/sensor assembly according to the present disclosure.

The foregoing disclosure relates to proximity sensing involving measurement of capacitance to determine the presence or absence of a hand or other body part of an occupant adjacent to a surface. As will be described below, a sensor/heater assembly according to the present disclosure includes a proximity sensor made of conductive thread attaching a heater wire to a heater carrier substrate. For example, proximity sensing may be used in a vehicle to sense a driver's hand(s) on a steering wheel of a vehicle or an occupant sitting in a seat. As can be appreciated, while specific examples are disclosed for illustration, the disclosure relates more generally to the detection of the presence or absence of a person in another location of a vehicle and/or in other non-vehicle environments.

In automotive applications, a heating system such as seat heater, steering wheel heater and/or a heater for another interior surface includes a heating wire that is attached to a heater carrier substrate. The heater carrier substrate is attached to a surface such as a steering wheel or seating surface below an outer layer coming into direct contact with an occupant. When enabled, power is supplied to the heating wire which causes heating of the wire and the adjacent surface of the steering wheel or the seat in contact with the occupant. For example, the heating wire may include a single insulated wire, a multi-strand insulated wire or multiple insulated wires that are wound together.

As will be described further below, conductive thread is sew in a regular or irregular pattern to attach the heater wire onto a heater carrier substrate. The conductive thread may include a single thread, two or more threads that are wound together or braided thread. In some examples, the conductive thread is uninsulated. The conductive thread is used for attachment and proximity sensing as will be described further below. Conductive thread attaches the heater wire to an occupant-facing surface where proximity detection is to be performed.

In some examples, the heating system performs time multiplexing between heating and proximity sensing functions. As will be described further below, the heater wire may be used for active shielding during proximity sensing to reduce system parasitic capacitance and/or a shield may be located on a second surface of the heater carrier substrate.

Multiple conductive threads can be used to attach a single heater wire or multiple heater wires to accommodate one zone or multiple sensing zones and/or heating zones. In some examples, the conductive thread (located on the proximity-sensing side) is sewn onto the first surface of the heater carrier substrate by a non-conductive thread located on the bottom side of the heater carrier substrate. The non-conductive thread reduces parasitic capacitance as compared to using conductive thread on both sides of the heater carrier substrate. The heater/sensor assembly described herein enables a simplified assembly process, electrically separates the heater from the sensor and enables the heater to be used as an active shield.

Referring now to FIG. 1A, a capacitive sensing and heating system 20 for a steering wheel 22 is shown. The capacitive sensing and heating system 20 includes a capacitive sensing and heating controller 24. In some examples, a switch 28 may be used by a passenger to actuate heating of the steering wheel 22. After sensing the capacitance (or resonant frequency), the capacitance sensing and heating controller 24 may report the results to one or more other vehicle controllers 26 via a vehicle communication bus. In some examples, the sensed capacitance may be used to determine whether or not the driver's hands are on the steering wheel.

The steering wheel 22 includes a heater/sensor assembly 42 that is located adjacent to or wrapped around a steering wheel support portion 40. The heater/sensor assembly 42 may define a single heating zone or a plurality of heating zones. Capacitance sensing may also be performed in a single sensing zone or a plurality of sensing zones. The capacitive sensing and heating controller 24 controls timing and the supply of power during heating. The capacitive sensing and heating controller 24 also controls timing and measurement of capacitance during sensing.

Referring now to FIG. 1B, a capacitive sensing and heating system 50 for a seat 51 is shown. The seat 51 includes a seat portion 52 and a backrest portion 54. The capacitive sensing and heating system 50 includes a capacitive sensing and heating controller 58. In some examples, a switch 62 may be used by a passenger to actuate heating of the seat 51.

In some examples, the switch 28 (FIG. 1A) and the switch 62 (FIG. 1B) include a physical switch or button. In other examples, the switches 28 and 62 may be accessed via a touchscreen associated with an infotainment system or other input device. In still other examples, the switches 28 and 62 are actuated automatically in conjunction with a heating, ventilation and air conditioning system (HVAC) (not shown).

The seat 51 includes a heater/sensor assembly 64 that is located in the seat portion 52. The heater/sensor assembly 64 may include a single zone or a plurality of heating and/or sensing zones. The capacitive sensing and heating controller 58 controls timing and the supply of power during heating. The capacitive sensing and heating controller 58 also controls measurement of capacitance. In some examples, the sensed capacitance may be used to determine whether or not an occupant is located in the seat.

Figure 2A:
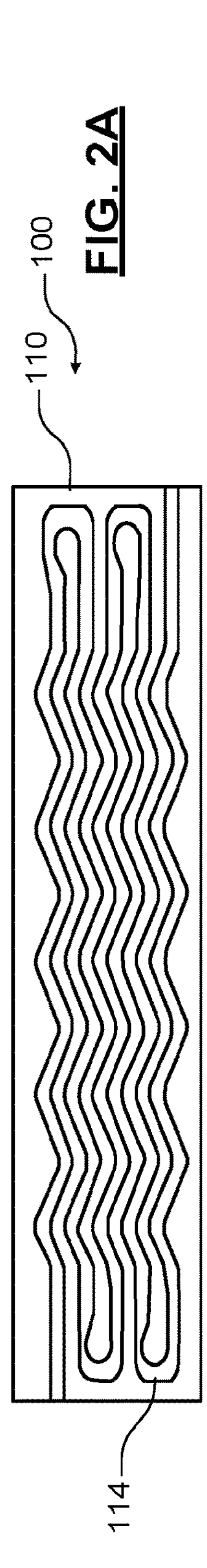
FIG. 2A is a plan view of an example of a heater/sensor assembly according to the present disclosure.
Figure 2C:
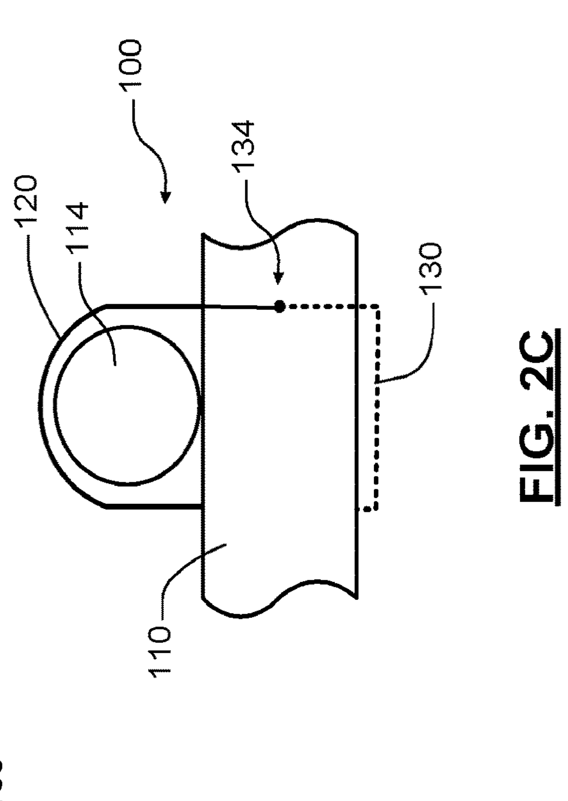
FIG. 2C is a side cross-sectional view of an example the heater/sensor assembly according to the present disclosure.
Figure 2B:
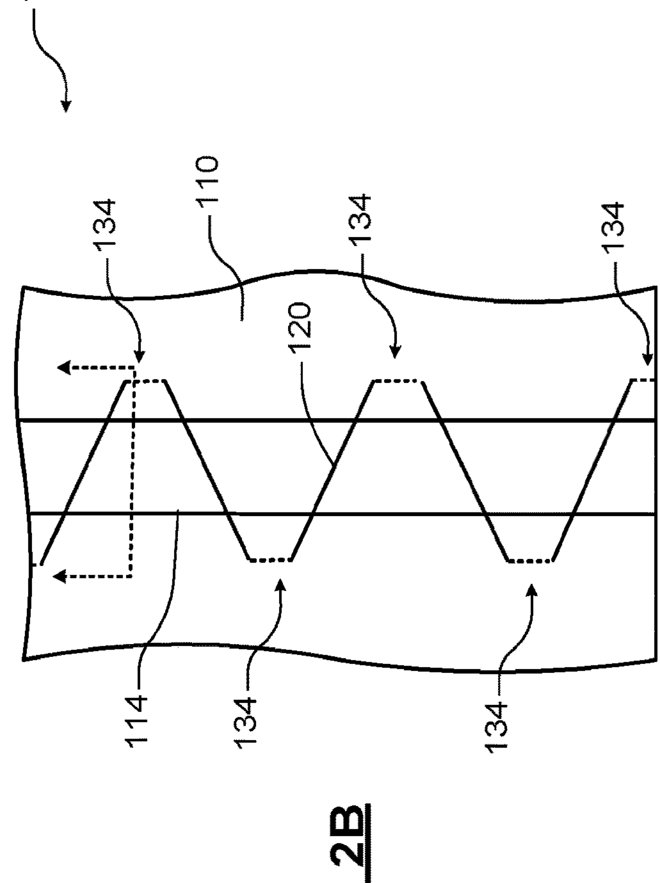
FIG. 2B is an enlarged plan view of an example of the heater/sensor assembly according to the present disclosure.

Referring now to FIGS. 2A-2C, various examples of the heater/sensor assembly 100 are shown. In FIG. 2A, the heater/sensor assembly 100 includes a heater carrier substrate 110 having a first surface and a second surface. A heater wire 114 is arranged on and in contact with the first surface of the heater carrier substrate 110. The heater wire 114 is arranged in a predetermined pattern (an example of which is shown in FIG. 2A).

The heater/sensor assembly 100 may include a single heater wire or multiple heater wires arranged in two or more zones. In some examples, the heater wires from two or more zones overlap as shown in FIG. 2A. In other words, two or more wires overlap if one heater wire is arranged between any two portions of another heater wire. In other examples, the heater wires from two or more zones do not overlap. The heater wire 114 may include a single wire that is insulated, a multi-strand or braided wire that is insulated by a single outer layer, a multi-strand wire that includes two or more individual wire(s) that are individually insulated, or two or more braided wires that are separately insulated.

In FIGS. 2B and 2C, the heater wire 114 is attached by conductive thread 120 to the first surface of the heater carrier substrate 110. In some examples, the heater wire 114 is attached to the heater carrier substrate 110 by sewing a conductive thread 120 on the first surface and a non-conductive thread 130 on the lower surface. During sewing, a needle and bobbin loop the conductive thread 120 around the non-conductive thread 130 at each stitch location 134. In some examples, the conductive thread 120 is sewn in a zig-zag pattern at an obtuse angle with respect to a line perpendicular to a longitudinal length of the heater wire 114, although other patterns can be used. In some examples, the stitch locations 134 on opposite sides of the heater wire are spaced longitudinally in a range from 1 mm to 10 mm. In some examples, the stitch locations 134 on opposite sides of the heater wire are spaced longitudinally in a range from 2 mm to 6 mm.

Figures 3A, 3B:
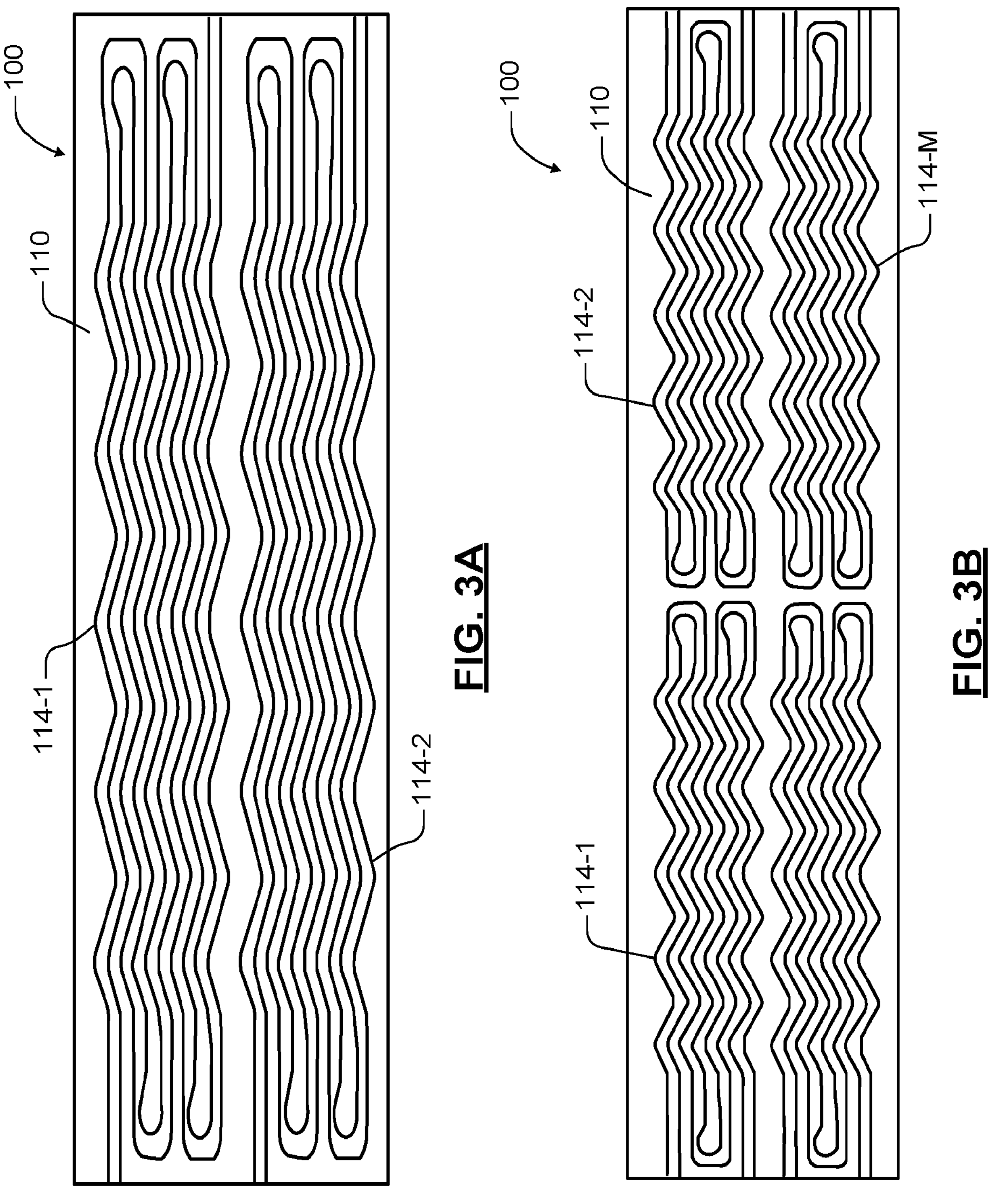
FIGS. 3A and 3B illustrate examples of patterns of the heater wire arranged on the heater carrier substrate according to the present disclosure.

Referring now to FIGS. 3A and 3B, examples of different arrangements of the heater wire 114 on the heater carrier substrate are shown. As described above, a single heater wire can be secured by conductive and non-conductive threads to the heater carrier substrate. Multiple heater wires (such as heater wire pairs 114-1 and 114-2 in FIG. 3A or heater wires pairs 114-1, 114-2, . . . , and 114-M, where M is an integer greater than 2 in FIG. 3B) can be secured by conductive and non-conductive threads to the heater carrier substrate. In some examples, multiple zones can be provided in one direction (e.g. vertically in FIG. 3A) or two or more orthogonal directions (e.g. vertically and horizontally in FIG. 3B).

In some examples, the heater wire 114 can be used as a shield layer since it is located immediately below the conductive thread 120 acting as the proximity sensor. In other examples, a shield (see e.g. FIG. 4B) is arranged below the second or lower surface of the heater carrier substrate to reduce capacitive coupling. In some examples, the shield may include a conductive surface or a pattern of conductive thread or wire attached to the second surface of the heater carrier substrate.

Figure 4A:
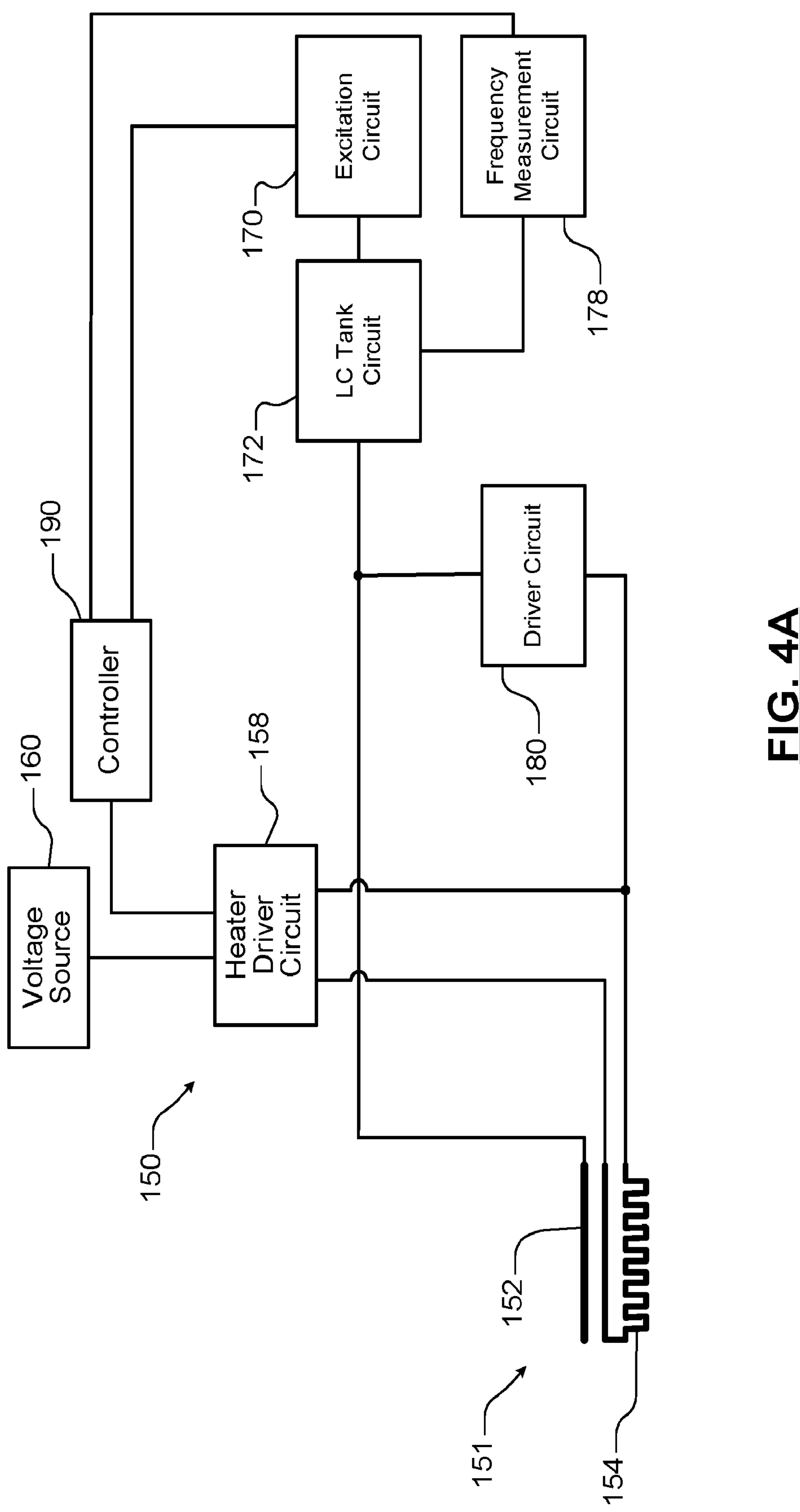
FIG. 4A is a simplified electrical schematic of an example of a capacitive sensing and heating system according to the present disclosure.
Figure 4B:
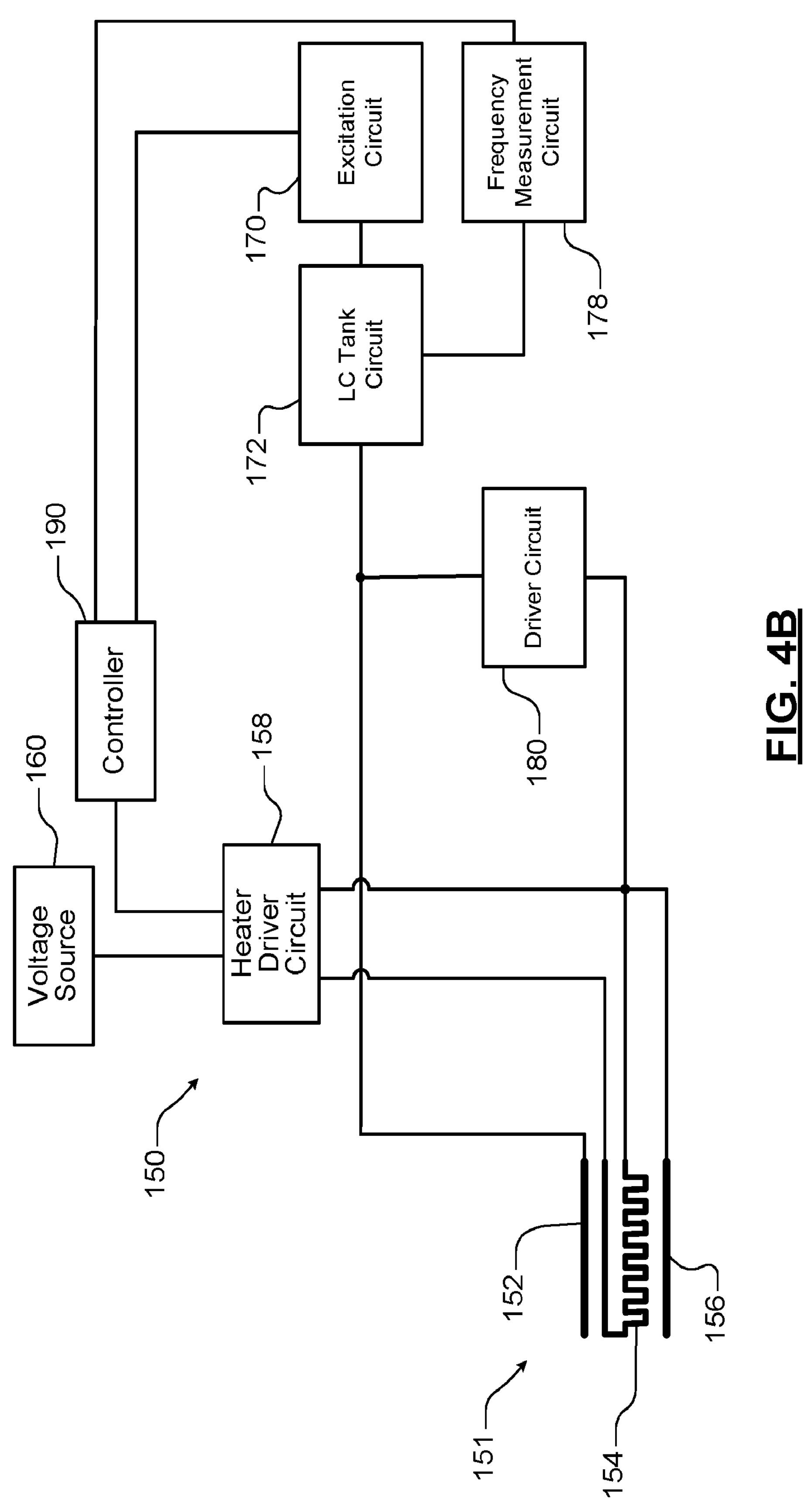
FIG. 4B is a simplified electrical schematic of another example of a capacitive sensing and heating system according to the present disclosure.

Referring now to FIGS. 4A and 4B, simplified electrical schematics of examples of capacitive sensing and heating systems according to the present disclosure are shown. In FIG. 4A, a capacitive sensing and heating system 150 includes a heater/sensor assembly 151. The heater/sensor assembly 151 includes a conductive thread 152 and a heater wire 154 as described above. While a single zone circuit will be described below for purposes of illustration and clarity, additional zones can be readily added.

A heater driver 158 selectively supplies power from a voltage source 160 to the heater wire 154 to increase a temperature of the steering wheel or seat. When capacitive sensing is desired, the heater driver 158 does not supply power to the heater wire 154.

An excitation circuit 170 selectively outputs an excitation signal (such as a square wave or other waveform shape) to a LC tank circuit 172 that is also connected to the conductive thread 152. The excitation signal is also output to the heater wire 154 via a driver circuit 180. When a passenger's hands are in the vicinity of the conductive thread 152, the capacitance of the combined circuit varies. The variation in capacitance, in turn, affects a resonant frequency of the LC tank circuit 172. The driver circuit 180 supplies a similar excitation signal to the heater wire 154 to eliminate the effect of stray capacitance between the conductive thread 152 and the heater wire 154 or other grounded structures nearby (since they are at the same voltage potential).

A frequency measurement circuit 178 measures the resonant frequency of the LC tank circuit 172. A controller 190 controls the timing and operation of heating and capacitance sensing performed by the heater driver 158, the excitation circuit 170 and the frequency measurement circuit 178.

In FIG. 4B, a shield layer 156 (such as a conductive surface or a pattern of conductive thread or wire) is arranged beneath the heater carrier substrate to reduce the effect of stray capacitance between the conductive thread 152 and the heater wire 154 or other grounded structures nearby.

Figure 5A:
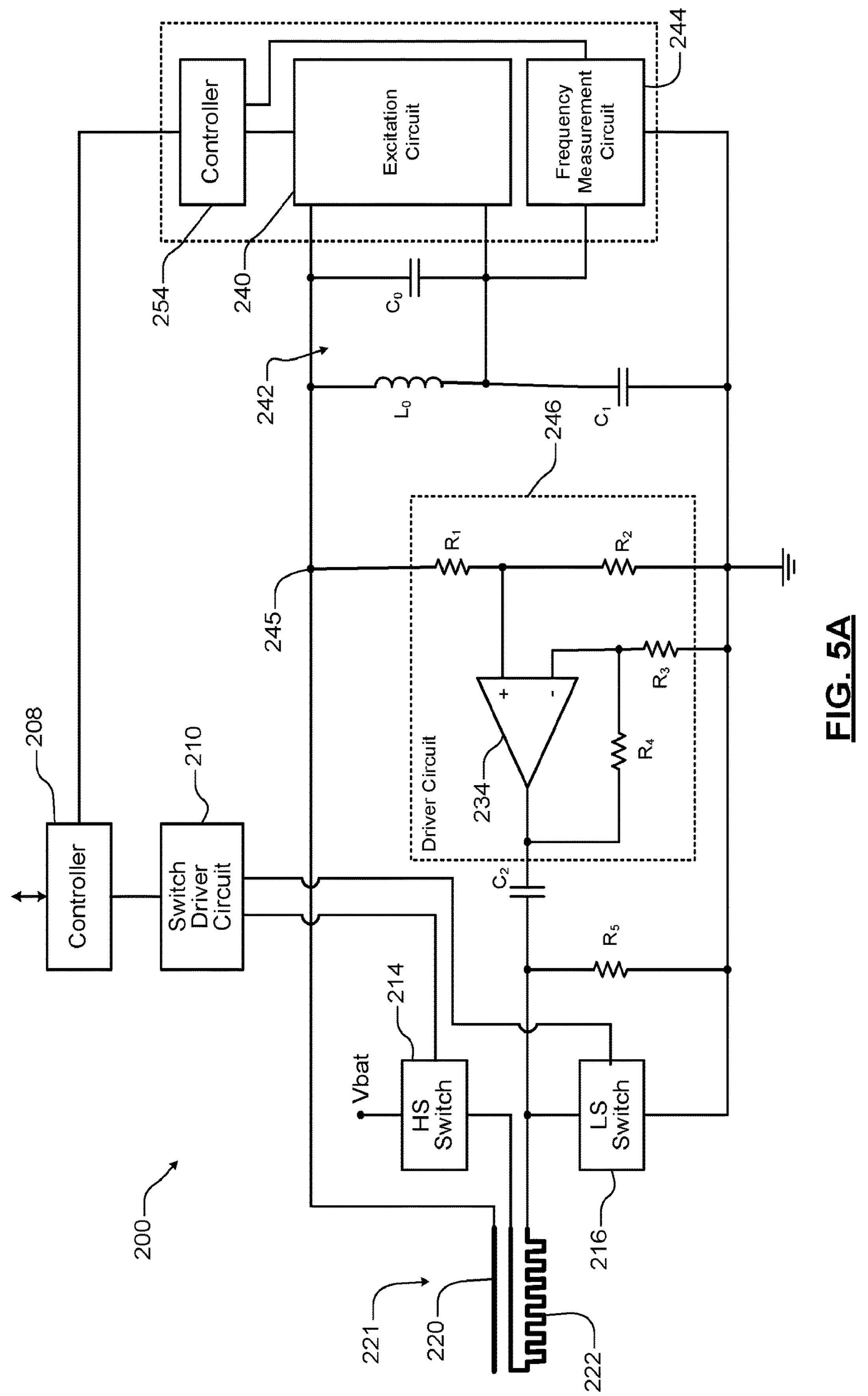
FIG. 5A is a more detailed electrical schematic of an example of a capacitive sensing and heating system according to the present disclosure.
Figure 5B:
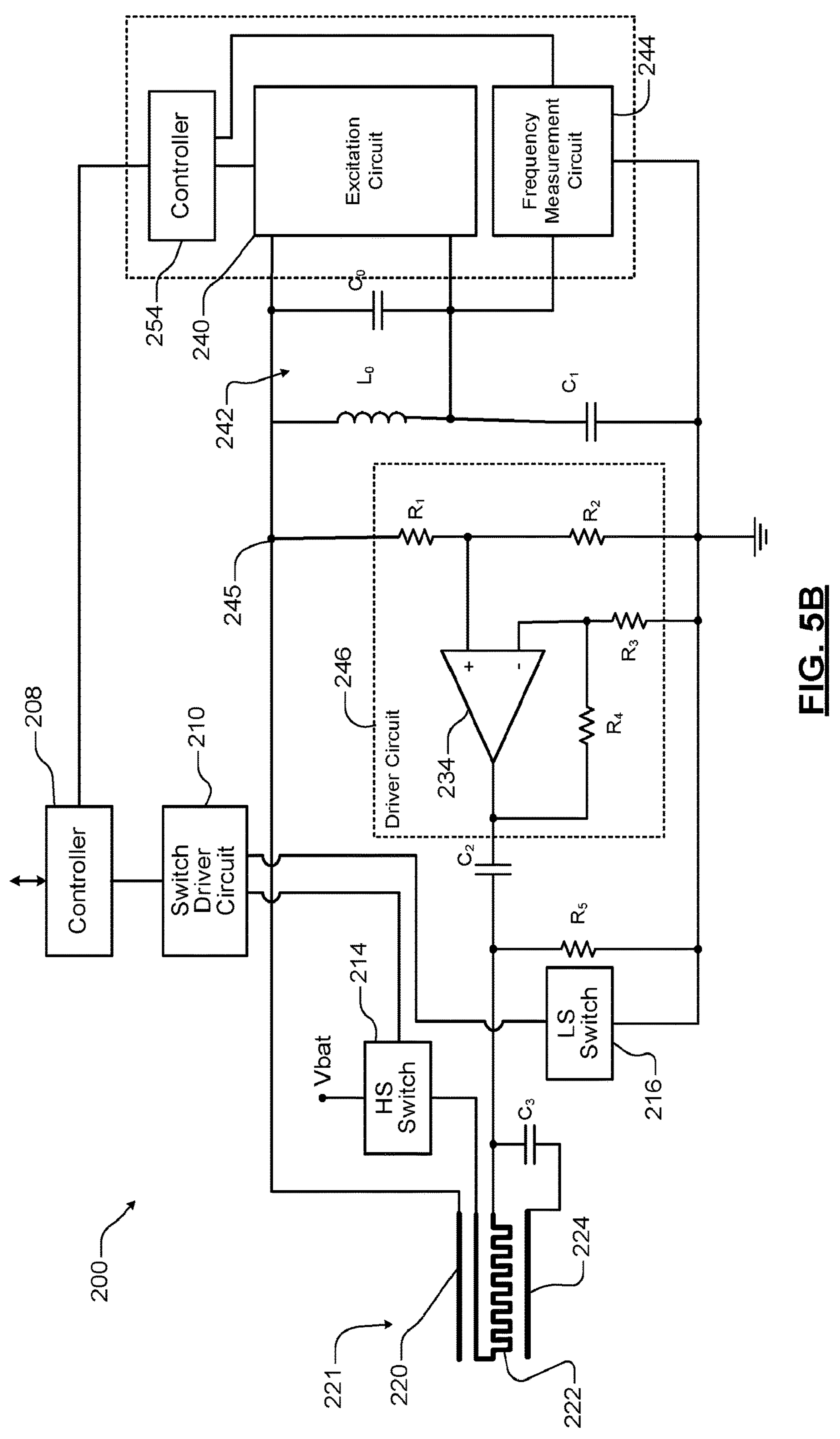
FIG. 5B is a more detailed electrical schematic of another example of a capacitive sensing and heating system according to the present disclosure.

Referring now to FIGS. 5A and 5B, more detailed electrical schematics for examples of capacitive sensing and heating systems according to the present disclosure are shown. In FIG. 5A, a capacitive sensing and heating system 200 includes a heater/sensor assembly 221. The heater/sensor assembly 221 include conductive thread 220 and a heater wire 222. A heater controller 208 enables and controls the switch driver 210, which selectively supplies control signals to a high side (HS) switch 214 and a low side (LS) switch 216. The HS switch 214 includes a first terminal that is connected to a vehicle battery or other power source. The HS switch 214 further includes a second terminal that is connected to one end of the heater wire 222.

The LS switch 216 includes a first terminal that is connected to an opposite end of the heater wire 222. The LS switch 216 further includes a second terminal that is connected to the reference potential. Control terminals of the HS switch 214 and the LS switch 216 are connected to the switch driver 210. In some examples, the switch driver 210 supplies a pulse width modulated (PWM) signal to the HS switch 214 and the LS switch 216 based upon demand for heating, although other types of modulation can be used.

An excitation circuit 240 outputs an excitation signal to a LC tank circuit 242 including an inductor $L_0$ and a capacitor $C_0$ that are connected in parallel to the excitation circuit 240. First terminals of the inductor $L_0$ and the capacitor $C_0$ are connected to a first node 245 that is also connected to the conductive thread 220. In some examples, a capacitance $C_1$ is connected between second terminals of the inductor $L_0$ and capacitor $C_0$ and a reference potential such as ground. The capacitance $C_1$ ensures equal load capacitance for both nodes of the LC tank circuit 242. In some cases this $C_1$ capacitor is not needed and can be omitted A driver circuit 246 includes first and second resistors $R_1$ and $R_2$, respectively that are connected in series between the first node 245 and the reference potential. A non-inverting input of an amplifier 234 is connected between the first resistor $R_1$ and the second resistor $R_2$. An inverting input of the amplifier 234 is connected by a third resistor $R_3$ to the reference potential. A fourth resistor $R_4$ is connected from an output of the amplifier 234 to the inverting input of the amplifier 234.

The output of the amplifier 234 is coupled by a second capacitor $C_2$ to the opposite end of the heater wire 222 and to a fifth resistor $R_5$ that is also connected to the reference potential. The capacitance $C_2$ connects the driving signal to the heater wire 222. The resistance $R_5$ ensures the ground DC potential during capacitance sensing.

During heating of the steering wheel, capacitive sensing is inactive. During capacitive sensing, the HS and LS switches disconnect the heater wire 222 from power. During capacitive sensing, the capacitance of the conductive thread 220 as well as the capacitance $C_0$ and $C_1$ and the inductance $L_0$ forms a parallel LC resonant circuit. The excitation circuit 240 generates the excitation signal causing the parallel LC resonant circuit to oscillate at a resonant frequency determined in part by the capacitance of the conductive thread 220, $C_0$, $C_1$ and $L_0$. The resonant frequency is measured by the frequency measurement circuit 244.

To lower the sensor capacitance between the conductive thread 220 and the heater wire 222, the measurement signal is also applied to the heater wire 222 using the driver circuit 246. The controller 254 controls the switch driver 210, the excitation circuit 240 and the frequency measurement circuit 244.

In FIG. 5B, a shield layer 224 is arranged on the second surface of the heater carrier substrate and adjacent to the heater wire 222 to provide additional shielding if needed. The driver circuit 246 is further connected to the shield layer 224 by a third capacitance $C_3$. The driver circuit 246 outputs a signal onto the conductive thread of the proximity sensor, the heater wire 222 and/or the shield layer 224 during excitation and/or frequency measurement to neutralize stray capacitance.

Referring now to FIG. 6, the controller 254 performs time multiplexing of heater enable and capacitive sensing enable signals. The controller performs heating and capacitive sensing during a period t. The period t includes a first sub-period $t_1$ during which heating is performed and a second sub-period $t_2$ during which capacitive sensing is performed. In some examples, the first sub-period $t_1$>the second sub-period $t_2$. In some examples, the first sub-period $t_1 \geq 85\%$ t and the second sub-period $t_2 \leq 15\%$ t, although other values can be used.

Referring now to FIG. 7, a method 300 for operating a capacitive sensing and heating system according to the present disclosure is shown. At 310, the method determines whether the vehicle is ON. In some examples, the vehicle is ON when an ignition switch or other switch is ON, however other criteria may be used. At 314, the method determines whether heating is enabled. If 314 is true, HS and LS switches are controlled based on heat demand at 318 and the method continues at 320.

At 320, the method determines whether capacitive sensing is enabled. If 320 is false, the method returns to 310. If 320 is true, the method continues at 324 and opens the HS and LS switches (and close the driver switch shown in FIG. 8). At 328, an excitation signal is output to the LC tank circuit and to the heater (or the heater and the shield layer if used). At 330, the resonant frequency is measured. At 332, the HS and the driver switch are opened (and LS switches is closed or opened). At 334, the resonant frequency is determined.

At 336, the total capacitance of the circuit is determined. At 340, either the controller or another vehicle controller determines whether the hands of the passengers are on the wheel (or the passenger is located in the seat) based on the calculated capacitance or delta capacitance values. In some examples, the resonant frequency or delta frequency can be used to identify whether or not the passengers hands are on the steering wheel. For example, the resonant frequency can be compared to one or more frequency thresholds or used to index a lookup table.

Examples of suitable materials for heating or sensing function can be any conductive material having a resistance value that is suitable for the particular application. Examples of materials that can be used for the heater wire include copper (Cu), an alloy of copper and nickel (Ni) such as CuNi (2-10%), other Cu alloys, carbon fibers, or other suitable materials. Examples of conductive thread materials include conductive fiber, fiber coated with metal such as silver (Ag), Ni and/or Cu, an alloy of copper and nickel such as CuNi (2-10%), other Cu alloys, conductive carbon fibers, or other suitable materials.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C #, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

None of the elements recited in the claims are intended to be a means-plus-function element within the meaning of 35 U.S.C. § 112(f) unless an element is expressly recited using the phrase "means for," or in the case of a method claim using the phrases "operation for" or "step for."

What is claimed is:

1. A heater/sensor assembly configured to perform heating and proximity sensing, the heater/sensor assembly comprising:

a heater carrier substrate including a first surface and a second surface that is opposite to the first surface;

a heater wire arranged in a predetermined pattern adjacent to and in contact with the first surface of the heater carrier substrate, wherein the heater wire is insulated; and a proximity sensor including an uninsulated conductive thread attaching the heater wire to the first surface of the heater carrier substrate;

wherein the uninsulated conductive thread is sewn onto the first surface of the heater carrier substrate by a non-conductive thread located on the second surface of the heater carrier substrate; and wherein the uninsulated conductive thread loops around the non-conductive thread at a plurality of stitch locations.

2. The heater/sensor assembly of claim 1, wherein the uninsulated conductive thread and the non-conductive thread loop around each other at stitch locations passing through the heater carrier substrate.

3. The heater/sensor assembly of claim 1, wherein the heater carrier substrate comprises a material selected from a group consisting of foam, felt, woven fabric and knitted fabric.

4. The heater/sensor assembly of claim 1, wherein the heater wire comprises a single insulated wire.

5. The heater/sensor assembly of claim 1, wherein the heater wire comprises a multi-strand insulated wire.

6. The heater/sensor assembly of claim 1, wherein the heater wire comprises two or more insulated wires that are wound around each other.

7. The heater/sensor assembly of claim 1, wherein the heater/sensor assembly is arranged around a steering wheel.

8. The heater/sensor assembly of claim 1, wherein the heater/sensor assembly is arranged in a vehicle seat assembly.

9. A capacitance measuring system for detecting an occupant of a vehicle, comprising:

the heater/sensor assembly of claim 1;

a measurement circuit configured to:

output an excitation signal to the measurement circuit and the heater/sensor assembly;

measure a resonant frequency of the measurement circuit and the heater/sensor assembly in response to the excitation signal;

determine at least one capacitance value based on the resonant frequency; and determine whether a body part is in proximity to the proximity sensor based on the at least one capacitance value.

10. The capacitive measuring system of claim 9, wherein the measurement circuit includes:

an LC tank circuit;

an excitation circuit in communication with the LC tank circuit and configured to generate the excitation signal that is output to the LC tank circuit;

a frequency measurement circuit in communication with the LC tank circuit and configured to measure the resonant frequency in response to the excitation signal; and a controller configured to:

trigger the excitation signal;

receive the resonant frequency;

determine the at least one capacitance value based on the resonant frequency; and determine whether the body part is in proximity to the proximity sensor based on the at least one capacitance value.

11. The capacitance measuring system of claim 10, further comprising a driver circuit arranged between the LC tank circuit and the heater wire and configured to drive the heater wire in response to the excitation signal.

12. The capacitance measuring system of claim 11, further comprising a shield layer arranged on the second surface of the heater carrier substrate adjacent to the heater wire.

13. The capacitance measuring system of claim 12, wherein the shield layer comprises a conductive layer attached to the second surface of the heater carrier substrate.

14. The capacitance measuring system of claim 12, wherein the shield layer comprises a predetermined pattern of the uninsulated conductive thread attached to the second surface of the heater carrier substrate.

15. The capacitance measuring system of claim 12, wherein the shield layer is connected by a capacitor to the heater wire and the driver circuit.

* * * * *